United States Patent [19]

Malhi

[11] Patent Number: 5,349,207
[45] Date of Patent: Sep. 20, 1994

[54] SILICON CARBIDE WAFER BONDED TO A SILICON WAFER

[75] Inventor: Satwinder Malhi, Garland, Tex.

[73] Assignee: Texas Instruments Incorporated, Dallas, Tex.

[21] Appl. No.: 20,820

[22] Filed: Feb. 22, 1993

[51] Int. Cl.⁵ .......................................... H01L 29/161
[52] U.S. Cl. ............................... 257/76; 257/77; 257/201; 257/192; 257/777; 437/100
[58] Field of Search ............... 257/76, 77, 201, 703, 257/704, 705, 706, 707, 777, 192; 437/100

[56] References Cited

U.S. PATENT DOCUMENTS

| | | | |
|---|---|---|---|
| 3,497,773 | 2/1970 | Kisinko et al. | 257/77 |
| 4,757,028 | 7/1988 | Kondoh et al. | 437/100 X |
| 4,762,806 | 8/1988 | Suzuki et al. | 437/100 |
| 5,200,022 | 4/1993 | Kong et al. | 437/100 X |

FOREIGN PATENT DOCUMENTS

| | | | |
|---|---|---|---|
| 60-136223 | 7/1985 | Japan | 257/77 |
| 1196873 | 8/1989 | Japan | 257/77 |

OTHER PUBLICATIONS

Harisma et al, "Silicon-on-Insulator Wafer Bonding-Wafer Thinning Technological Evaluations," *Japanese Journal Of Applied Physics*, vol. 28, No. 8, Aug. 1989, pp. 1426-1443.

J. W. Palmour, et al. "Characterization of Device Parameters In High-Temperature Metal-Oxide-Semiconductor field-effect transistors in $\beta$-SiC Thin Films", Apr. 26, 1988, extracted from: J. Appl. Phys. 64(4), Aug. 15, 1988, p. 2168-2177.

R. D. Black, et al. "Silicon and Silicon Dioxide Thermal Bonding for Silicon-On-Insulator Applications", Dec. 8, 1987, extracted from: J. Appl. Phys. 63(8), Apr. 15, 1988, p. 2773-2777.

Hiroshi Gotou, et al. "SOI-Device on Bonded Wafer", Dec. 25, 1988, p. 407-418, extracted from: Fujitsu Scientific & Technical Journal vol. 24, No. 4.

Robert F. Davis, et al., "Thin Film Deposition and Microelectronic and Optoelectronic Device Fabrication and Characterization in Monocrystalline Alpha and Beta Silicon Carbine", extracted from: IEEE vol. 79, No. 5, May 1991, p. 677-701.

K. Furukawa, et al. "Insulated-Gate and Junction-Gate FET's of CVD-Grown $\beta$-SiC", extracted from: IEEE vol. EDL-8, No. 2, Feb. 1987, pp. 48-49.

K. Shibahara, et al. "Inversion-Type N-Channel MOSFET Using Antiphase-Domain Free Cubic-SiC Grown on Si(100)" extracted from: (1966 International) Conference on Solid State Device and Materials, Tokyo, 1986, pp. 717-720.

*Primary Examiner*—William Mintel
*Attorney, Agent, or Firm*—Jacquelin J. Garner; Richard L. Donaldson; William E. Hiller

[57] ABSTRACT

A silicon carbide structure (10) and method capable of using existing silicon wafer fabrication facilities. A silicon wafer (20) is provided which has a first diameter. At least one silicon carbide wafer (30) is provided which has a given width and length (or diameter). The width and length (or diameter) of the silicon carbide wafer (30) are smaller than the diameter of the silicon wafer (20). The silicon wafer (20) and the silicon carbide wafer (30) are then bonded together. The bonding layer (58) may comprise silicon germanium, silicon dioxide, silicate glass or other materials. Structures such as MOSFET (62) may be then formed in silicon carbide wafer (30).

20 Claims, 7 Drawing Sheets

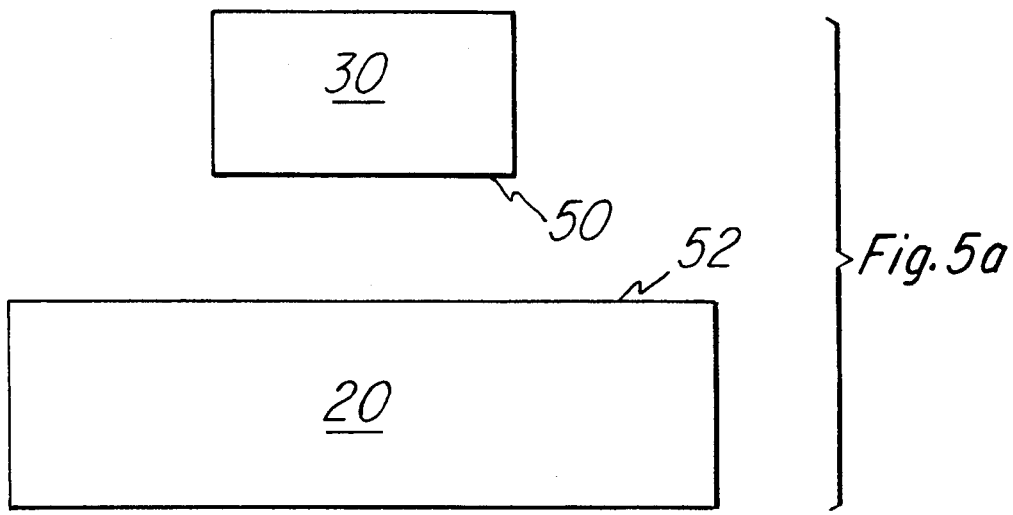
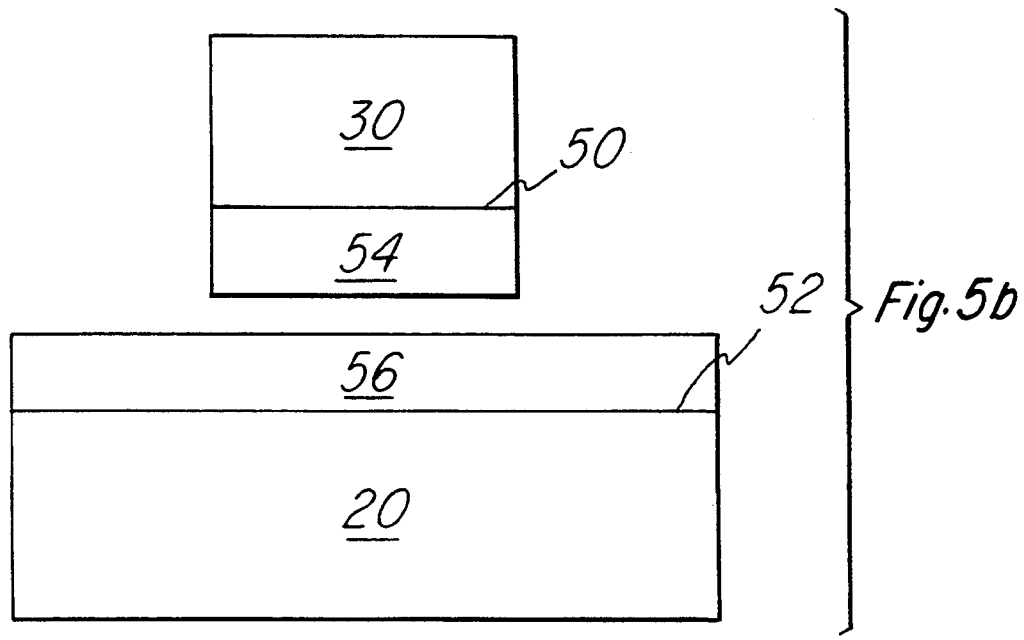

SILICON CARBIDE WAFER BONDED TO A SILICON WAFER

FIELD OF THE INVENTION

This invention generally relates to semiconductor devices and processes and more specifically to silicon carbide wafers.

BACKGROUND OF THE INVENTION

A growing segment of the semiconductor business is high voltage/high power devices and integrated circuits. A critical element in this business is the power MOSFET. Power MOSFETs have many diverse applications in automotive, communications, consumer, data processing, industrial and military markets. For example, power MOSFETs may be used as drivers for motors, lamps, or displays. Most power MOSFETs are built in silicon. However, the performance of power MOSFETs built in silicon are already close to their theoretical limits. Therefore, research efforts have turned to silicon carbide (SIC) wafers. SiC has the potential for significantly (as much as two orders of magnitude) higher performance power MOSFETs compared to silicon wafers. However, one of the limitations in using SiC is that the wafer size is much smaller than present silicon wafers. SiC wafers have been limited to approximately I inch diameters. This inhibits their use or production in existing silicon wafer fabrication facilities built to handle large wafers.

Both depletion mode and inversion mode MOSFETs have been demonstrated in SiC. A depletion mode device is shown in FIG. 1a. The MOSFET channel was built in a 1.2 $\mu$m thick n-type b-SiC epitaxial layer. A polysilicon annular gate electrode was used. Source/drain regions were implanted at 773 K. and contacted with tantalum silicide (TaSi2) which was annealed at 1173 K. The depletion threshold voltage was $-12.9$ V and the device operated up to a drain voltage of 25 V at temperatures up to 923 K. An inversion mode MOSFET is shown in FIG. 1b. A p-type b-SiC epitaxial layer was used. The threshold voltage was 9 V and the device operated up to 923 K.

SUMMARY OF THE INVENTION

Generally, and in one form of the invention, a silicon carbide structure and method capable of using existing silicon wafer fabrication facilities is disclosed. A silicon wafer is provided which has a first diameter. At least one silicon carbide wafer is provided which has a given width and length. The width and length of the silicon carbide wafer are smaller than the diameter of the silicon wafer. The silicon carbide wafer is then bonded to the silicon wafer.

An advantage of the invention is providing a structure for allowing small diameter silicon carbide wafers to be processed in existing silicon wafer fabrication facilities.

A further advantage of the invention is the capability to use existing silicon wafer fabrication facilities and still obtain greater performance than is possible with silicon wafers.

BRIEF DESCRIPTION OF THE DRAWINGS

In the drawings:

FIGS. 5a–e are cross-sectional views illustrating various states of fabrication of the preferred embodiment of the invention utilizing a silicon germanium bond.

Corresponding numerals and symbols in the different figures refer to corresponding parts unless otherwise indicated.

DETAILED DESCRIPTION OF PREFERRED EMBODIMENTS

Figure 1B:
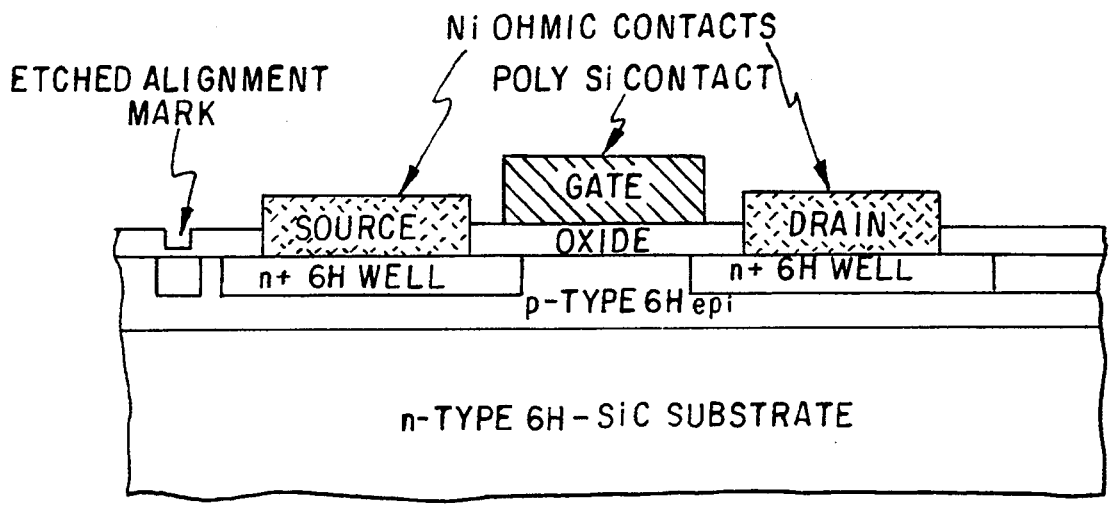
FIGS. 1a–b are cross-sectional views of prior art MOSFETs built in SiC.
Figure 1A:
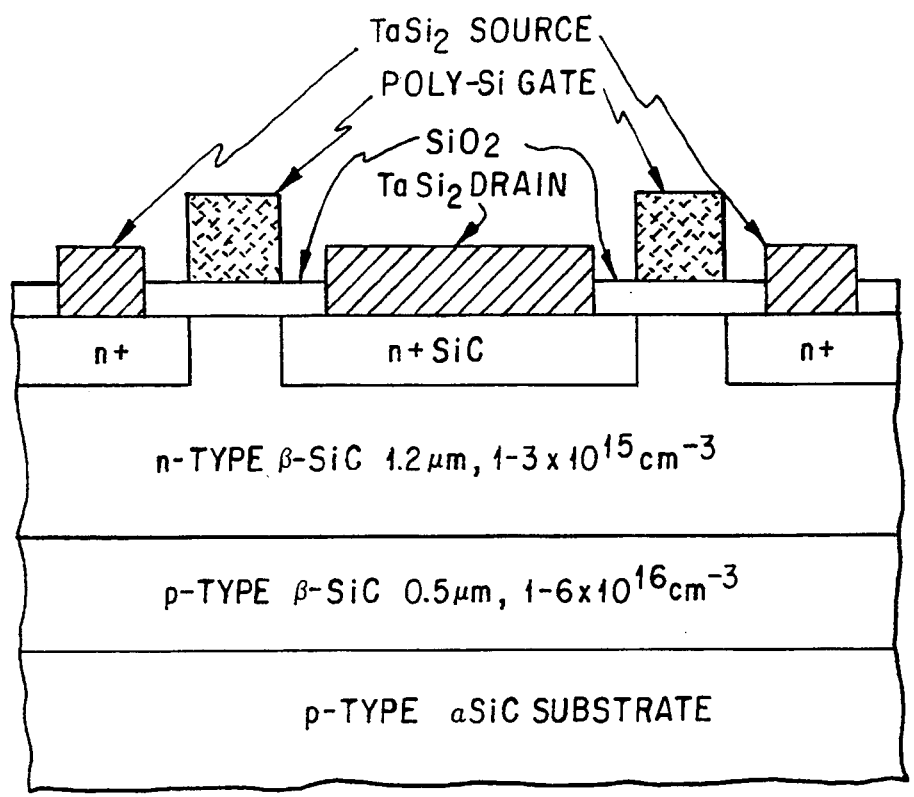
Figure 2:
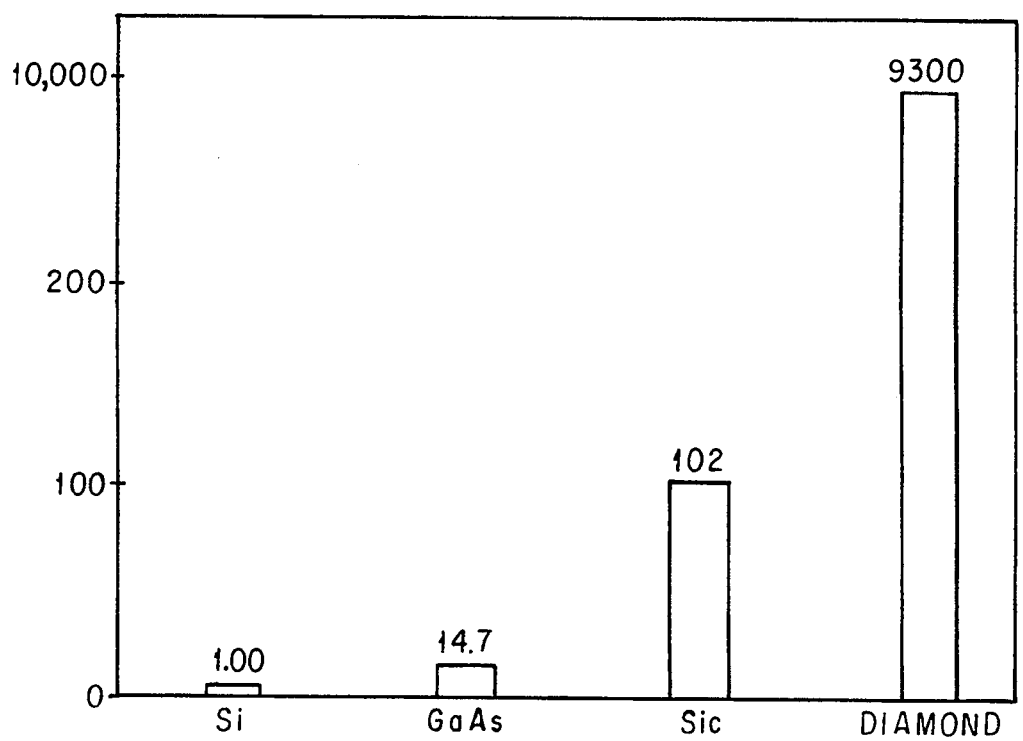
FIG. 2 is a plot of 1/Rsp characteristics for various materials.

The power MOSFET is a switch, much like an electromechanical relay is a switch, but it is much smaller, more reliable, and can be electronically controlled. The key performance figure for the power MOSFET is specific on-resistance (Rsp), or the resistance of this switch per unit die area when the device is switched on. A goal in power MOSFET technology is reducing the specific on-resistance as much as possible. This leads to 1/Rsp as a convenient figure of merit which should be maximized. The Rsp, depends on the semiconductor material properties, and the figure of merit can be written as $$\text{FIGURE OF MERIT} = 1/\text{Rsp} \sim = \ ^*\mu^* E_c^3$$

where is the dielectric constant, $\mu$ is the carrier mobility, Ec is the avalanche electric field. Table 1 lists the properties of a few candidate materials and FIG. 2 plots the 1/Rsp figure of merit.

TABLE 1

| | | Material Properties and Figure of Merit | | | | |
|---|---|---|---|---|---|---|
| Parameter | Symbol | Units | Si | GaAs | SiC | Diamond |
| Relative Dielectric Constant | | C/V · cm | 11.8 | 12.8 | 9.7 | 5.5 |
| Mobility | $\mu$ | cm$^2$/V · sec | 1400 | 8000 | 300 | 2200 |
| Critical Field | $E_c$ | V/cm | $3 \times 10^5$ | $4 \times 10^5$ | $2.5 \times 10^6$ | $7 \times 10^6$ |
| Figure of Merit Factor | $\epsilon^*\mu^*E_c^3$ | — | $4.46 \times 10^{20}$ | $6.55 \times 10^{21}$ | $4.55 \times 10^{22}$ | $4.15 \times 10^{24}$ |
| Relative Figure of Merit | — | — | 1 | 14.7 | 102 | 9300 |

Gallium arsenide (GaAs) has the potential of an order of magnitude improvement in performance. The material is also available up to 4" wafer size. But it has major drawbacks for power MOSFET use. First, it is very difficult to grow a high quality gate insulator in this material. Second, this material cannot be processed in the same wafer fabrication facilities that run silicon without cross-contamination as gallium and arsenic are contaminants in silicon.

Diamond has the potential of highest performance. But diamond technology also lacks the ability to grow a high quality gate insulator. The material is difficult to process, is prohibitively expensive, and is presently not available commercially in wafer form.

SiC has the potential of 100× higher performance compared to Si power MOSFETS. It can be oxidized to form high quality silicon dioxide (SiO2) to serve as gate insulator. SiC wafers are commercially available. This material can be processed in the same wafer fabrication facilities that produce silicon devices without any cross-contamination problem. This is very important since new dedicated wafer fabrication facilities require huge capital investment.

TABLE 2

Rating of Candidate Materials for Power MOSFET

| Criteria | GaAs | SiC | Diamond |
|---|---|---|---|
| Figure of Merit | Good | Very Good | Excellent |
| Gate Insulator | Poor | Good | Poor |
| Cost | Good | Good | Poor |
| Availability | Very Good | Good | Poor |
| Process in Si Wafer-fabs | Poor | Excellent | Poor |
| Overall Rating | Good | Excellent | Poor |

TABLE 2

Rating of Candidate Materials for Power MOSFET

Table 2 summarizes ratings of candidate materials in various categories. Due to a combination of reasons involving theoretical performance potential, device technology issues, economic and practicality factors, SiC is the preferred material for dramatic performance improvement in power MOSFETs.

Unfortunately, one of the limitations in using SiC is that the wafer size is much smaller than traditional silicon wafers. SiC wafers have been limited to approximately 1-2 inch diameters. The result of this limitation is that existing silicon wafer fabrication equipment cannot be used. Re-tooling wafer fabrication facilities would prove very costly. An advantage of the preferred embodiment is providing a SiC wafer, or wafers, which can use existing silicon wafer fabrication equipment built to handle larger silicon wafers.

Figure 3A:
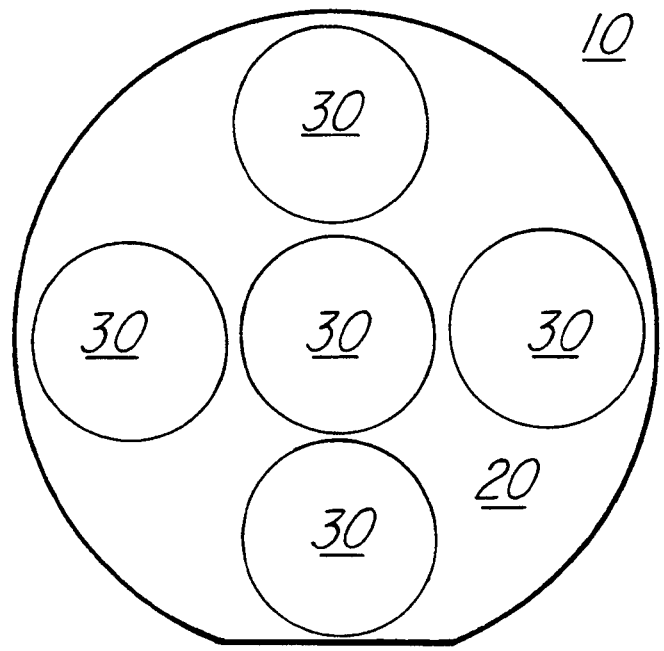
FIG. 3a is a top view of the preferred embodiment of the invention.
Figure 3B:
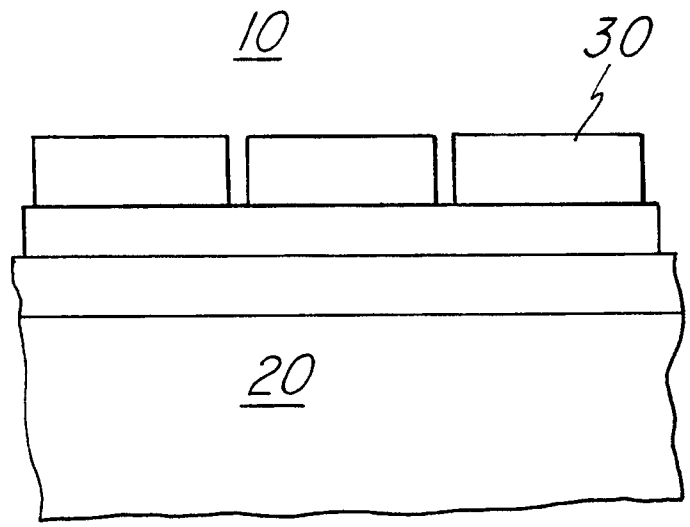
FIG. 3b is a cross-sectional view of the preferred embodiment of the invention.

The preferred embodiment of the invention will now be described with reference to FIGS. 3a-b. One or more SiC wafers 30 are bonded to a large diameter silicon wafer 20. The diameter of silicon wafer 20 will typically be in the range 4 to 8 inches. The composite wafer 10 having a silicon holder 20 and several SiC wafers 30 can be handled with standard wafer fabrication equipment. FIG. 3a depicts silicon carbide wafers 30 as circular, but it will be apparent to those skilled in the art that the SiC wafers 30 need not be circular or any other particular shape. A mosaic pattern may alternatively be used.

Figure 4A:
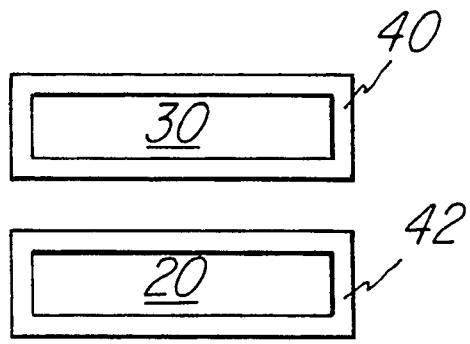
FIGS. 4a–c are cross-sectional views illustrating various states of fabrication of the preferred embodiment of the invention utilizing an oxide to oxide bond.
Figure 4B:
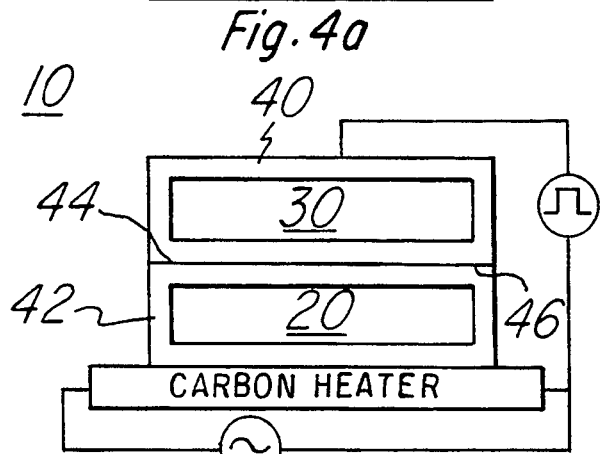
Figure 4C:
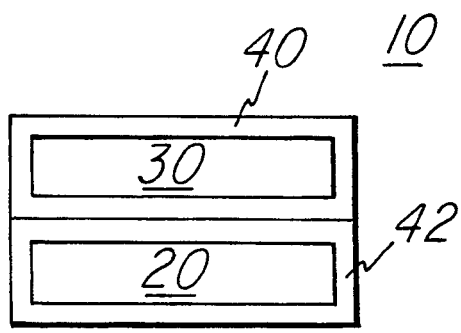

Several methods may be used to bond the SiC wafer 30 to the silicon wafer 20. Because of the material properties of SiC, many techniques developed for use in SOI processing may be used to bond SiC wafer 30 to silicon wafer 20. For example, a high temperature oxide to oxide bond may be used. Referring to FIG. 4a, SiC wafer 30 and silicon wafer 20 are thermally oxidized to form oxide layers 40 and 42. Oxide layers 40 and 42 are each on the order of 0.5 μm thick. The surface 44 of oxide layer 40 may then be bonded to the surface 46 of oxide layer 42 using a carbon heater at a reduced pressure of $10^{-1}$ Pa while preferably applying a pulse voltage between the SiC wafer 30 and the silicon wafer 20 to provide an electrostatic force, as shown in FIG. 4b. The bonding temperature is on the order of 800° C. The amplitude of the voltage is on the order of 300 V, its width is on the order of 100 ms, and its period is on the order of 500 ms. After bonding, the composite wafer 10 may be annealed, as shown in FIG. 4c. Annealing may, for example, be for approximately 30 minutes in a nitrogen ambient at approximately 1100° C. Annealing increases the bond strength. Other methods will be apparent to those skilled in the art, such as metal bonding in a vacuum, bonding by glass-layer fusing and oxygen-assisted bonding.

Figure 5C:
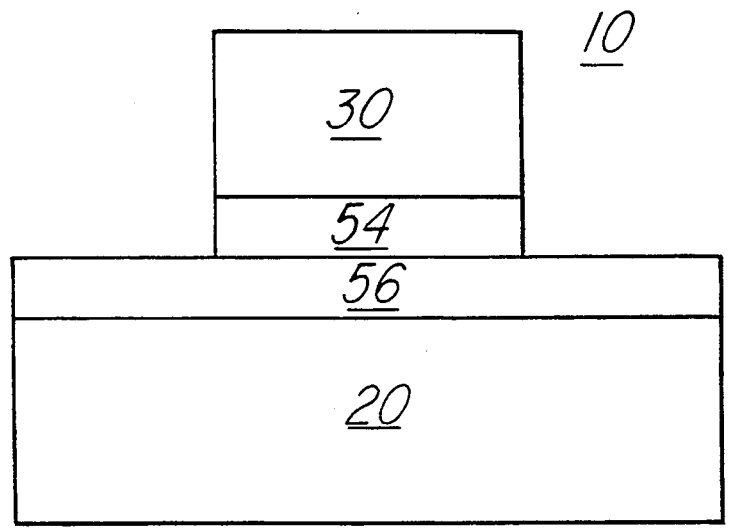
Figure 5D:
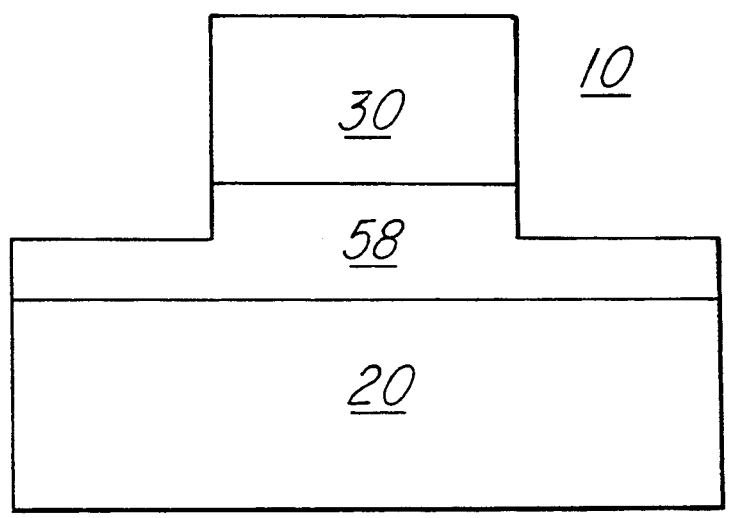
Figure 5E:
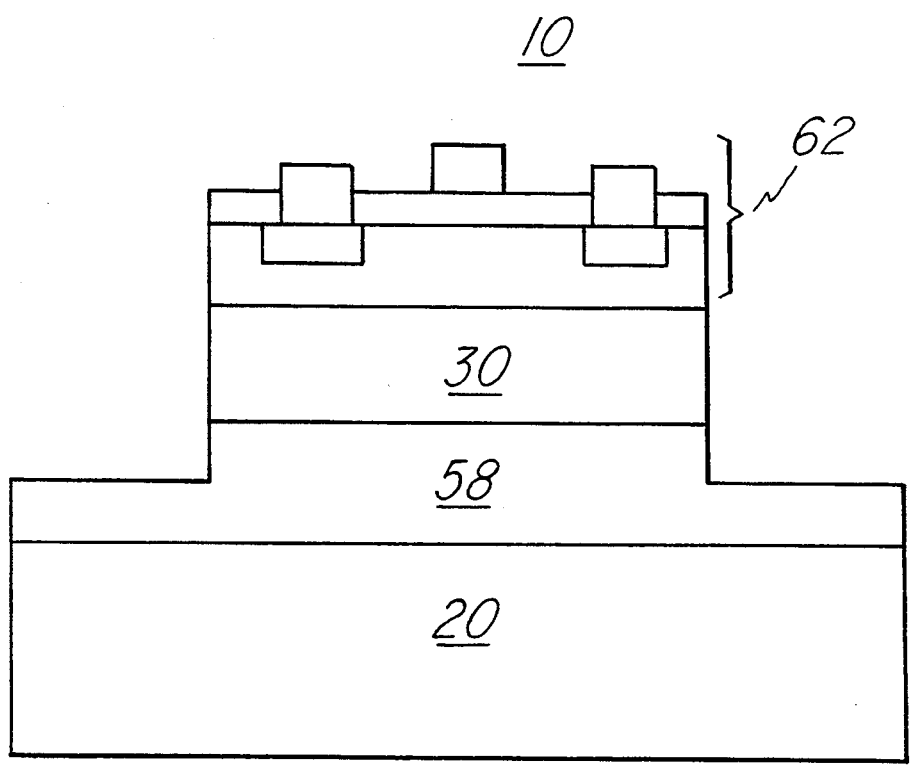

However, the preferred bonding method uses a metal alloy such as silicon germanium (SiGe) and is described in co-pending U.S. patent application Ser. No. 08/019,925, filed Feb. 19, 1993. Referring to FIG. 5a, SiC surface 50 and silicon surface 52 are well polished. Next, layers of SiGe alloy 54 and 56 are deposited on both SiC surface 50 and silicon surface 52, as shown in FIG. 5b. SiGe layers 54 and 56 may be deposited by chemical vapor deposition (CVD). Other methods such as molecular beam epitaxy (MBE) may alternatively be used. SiGe layers 54 and 56 are then brought in contact with one another (preferably under pressure) and the composite wafer 10 is heated to a temperature above the melting point of SiGe layers 54 and 56, as shown in FIG. 5c. The melting point will be between 950° C. and 1400° C. depending on the germanium concentration in the SiGe layers 54 and 56. When composite wafer 10 is heated, SiGe layers 54 and 56 melt and upon cooling form an inseparable bond layer 58, as shown in FIG. 5d. Once bond layer 58 is formed, structures such as transistor 62 may be formed in SiC wafer 30, as shown in FIG. 5e. Methods for forming transistor 62 will be apparent to those skilled in the art. Transistor 62 may, for example, comprise a MOSFET, MESFET, JFET or bipolar transistor.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A silicon carbide structure capable of using existing silicon wafer fabrication facilities comprising:
    a. a silicon wafer having a first diameter;
    b. at least one silicon carbide wafer having a predetermined maximum width and a predetermined maximum length, wherein said predetermined maximum width and predetermined maximum length are smaller than said first diameter; and
    c. a bonding layer located between said silicon wafer and said at least one silicon carbide wafer.

2. The structure of claim 1 wherein said first diameter is in the range from four to eight inches.

3. The structure of claim 1 wherein said first diameter is approximately six inches.

4. The structure of claim 1 wherein said at least one silicon carbide wafer is circular and has a second diameter in the range of one to two inches.

5. The structure of claim 1 wherein said at least one silicon carbide wafer comprises a plurality of silicon carbide wafers arranged in a mosaic pattern.

6. The structure of claim 1 wherein said at least one silicon carbide wafer comprises a plurality of silicon carbide wafers having a second diameter, said second diameter smaller than said first diameter.

7. The structure of claim 1 wherein said bonding layer comprises silicon dioxide.

8. The structure of claim 1 wherein said bonding layer comprises silicon germanium.

9. The structure of claim 1 wherein said bonding layer comprises silicate glass.

10. The structure of claim 1 wherein said bonding layer has a melting point greater than 950° C.

11. The structure of claim 1 further comprising a transistor located in said at least one silicon carbide wafer.

12. The structure of claim 11 wherein said transistor comprises a MOSFET.

13. A silicon carbide structure capable of using existing silicon wafer fabrication facilities comprising:
a silicon wafer having a first diameter;
at least one silicon carbide wafer having a predetermined maximum width and a predetermined maximum length, wherein said predetermined maximum width and predetermined maximum length are smaller than said first diameter; and
a silicon germanium bonding layer located between said silicon wafer and said at least one silicon carbide wafer.

14. The structure of claim 13 wherein said at least one silicon carbide wafer comprises a plurality of silicon carbide wafers having a second diameter, said second diameter smaller than said first diameter.

15. The structure of claim 13 further comprising a transistor located in said at least one silicon carbide wafer.

16. The structure of claim 15 wherein said transistor comprises a MOSFET.

17. A silicon carbide structure capable of using existing silicon wafer fabrication facilities comprising:
a silicon wafer having a first diameter;
at least one silicon carbide wafer having a predetermined maximum width and a predetermined maximum length, wherein said predetermined maximum width and predetermined maximum length are smaller than said first diameter; and
a silicate glass bonding layer located between said silicon wafer and said at least one silicon carbide wafer.

18. The structure of claim 17 wherein said at least one silicon carbide wafer comprises a plurality of silicon carbide wafers having a second diameter, said second diameter smaller than said first diameter.

19. The structure of claim 17 further comprising a transistor located in said at least one silicon carbide wafer.

20. The structure of claim 19 wherein said transistor comprises a MOSFET.

* * * * *